United States Patent
Hanaoka

(10) Patent No.: US 10,419,039 B2
(45) Date of Patent: Sep. 17, 2019

(54) FRONT END MODULE AND COMMUNICATION APPARATUS

(71) Applicant: Murata Manufacturing Co., Ltd., Nagaokakyo-shi, Kyoto-fu (JP)

(72) Inventor: Kunitoshi Hanaoka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/237,797

(22) Filed: Jan. 2, 2019

(65) Prior Publication Data

US 2019/0140670 A1 May 9, 2019

Related U.S. Application Data

(63) Continuation of application No. PCT/JP2017/019262, filed on May 23, 2017.

(30) Foreign Application Priority Data

Jul. 8, 2016 (JP) .................................. 2016-136424

(51) Int. Cl.
*H04B 1/00* (2006.01)
*H03H 7/42* (2006.01)
(Continued)

(52) U.S. Cl.
CPC .............. *H04B 1/006* (2013.01); *H03H 7/42* (2013.01); *H03H 7/46* (2013.01); *H04B 1/00* (2013.01);
(Continued)

(58) Field of Classification Search
CPC . H04B 1/00; H04B 1/006; H04B 1/50; H04B 1/18; H04B 1/405; H03H 7/42; H03H 7/46; H04L 5/0035
See application file for complete search history.

(56) References Cited

U.S. PATENT DOCUMENTS

2010/0148886 A1  6/2010  Inoue et al.
2012/0201153 A1  8/2012  Bharadia et al.
(Continued)

FOREIGN PATENT DOCUMENTS

JP  2004-194097 A  7/2004
JP  2007-158987 A  6/2007
(Continued)

OTHER PUBLICATIONS

Official Communication issued in International Patent Application No. PCT/JP2017/019262, dated Aug. 8, 2017.

*Primary Examiner* — Wayne H Cai
(74) *Attorney, Agent, or Firm* — Keating & Bennett, LLP

(57) ABSTRACT

A front end module that performs a CA method includes a signal path through which a signal of a first frequency band propagates, a signal path through which a signal of a second frequency band propagates, a switch module that includes antenna terminals and selection terminals and is connected to antenna elements, and a balun that is disposed at the signal path. First and second balanced terminals of the balun are connected to the selection terminals, and the balun causes a fundamental wave or harmonic of a transmission signal of the first frequency band input through an unbalanced terminal to branch into branch signals having opposite phases and outputs the branch signals to the first balanced terminal and the second balanced terminal.

20 Claims, 5 Drawing Sheets

(51) Int. Cl.
  *H03H 7/46*   (2006.01)
  *H04B 1/50*   (2006.01)
  *H04B 1/18*   (2006.01)
  *H04B 1/405*  (2015.01)
  *H04L 5/00*   (2006.01)

(52) U.S. Cl.
  CPC .............. *H04B 1/18* (2013.01); *H04B 1/405* (2013.01); *H04B 1/50* (2013.01); *H04L 5/0035* (2013.01)

(56) References Cited

U.S. PATENT DOCUMENTS

| | | | |
|---|---|---|---|
| 2013/0078937 A1* | 3/2013 | Leverich | H03F 3/19 |
| | | | 455/232.1 |
| 2014/0125428 A1 | 5/2014 | Iwaki | |
| 2015/0049666 A1* | 2/2015 | Montalvo | H04W 88/10 |
| | | | 370/328 |
| 2015/0092683 A1* | 4/2015 | Rangarajan | H04W 48/18 |
| | | | 370/329 |
| 2018/0097540 A1 | 4/2018 | Uejima | |

FOREIGN PATENT DOCUMENTS

| | | |
|---|---|---|
| JP | 2014-096671 A | 5/2014 |
| WO | 2009/078095 A1 | 6/2009 |
| WO | 2016/194923 A1 | 12/2016 |

\* cited by examiner

FRONT END MODULE AND COMMUNICATION APPARATUS

CROSS REFERENCE TO RELATED APPLICATIONS

This application claims the benefit of priority to Japanese Patent Application No. 2016-136424 filed on Jul. 8, 2016 and is a Continuation Application of PCT Application No. PCT/JP2017/019262 filed on May 23, 2017. The entire contents of each application are hereby incorporated herein by reference.

BACKGROUND OF THE INVENTION

1. Field of the Invention

The present invention relates to a front end module and a communication apparatus that process high-frequency signals.

2. Description of the Related Art

In recent years, portable terminals have been demanded to support multiple frequencies and wireless methods (multiple bands and multiple modes). Therefore, a front end module of such a portable terminal has been required to perform high-speed processing without degrading the quality of a plurality of transmission and reception signals.

In Japanese Unexamined Patent Application Publication No. 2014-96671, a switching device and a module in which isolation characteristics between two paths (between a transmission path and a reception path) used for transmission and reception of a high-frequency signal in a specific frequency band are improved are disclosed. More specifically, in a configuration in which one of the two paths is selected as a signal propagation path, by connecting two input and output terminals by a delay line, a signal leaking from one of the paths to the other one of the paths is canceled out.

However, the conventional switching device mentioned above is applied to a system that always selects one of two signal paths to allow a signal to propagate through the selected signal path.

In contrast, in a system that uses a carrier aggregation (CA) method that allows signals of different frequency bands to propagate at the same time, signals of multiple frequency bands are caused to propagate at the same time. To ensure desired isolation characteristics between a plurality of signal paths to be used for propagation of signals of multiple frequency bands that are subjected to a CA operation, a configuration in which the plurality of signal paths used at the same time are directly connected by a delay line, such as the configuration of the conventional switching device mentioned above is not suitable. With a configuration in which switching between two signal paths is performed by a switch without a CA operation, a reception signal flowing into a reception path from a transmission path is regulated by the isolation characteristics of the switch. In contrast, with a configuration with a CA operation, in which two signal paths are connected at the same time within a switch, merely intensifying the isolation of the switch itself is not sufficient.

SUMMARY OF THE INVENTION

Preferred embodiments of the present invention provide front end modules and communication apparatuses that each ensure excellent isolation characteristics between a plurality of signal paths having different frequency bands in a carrier aggregation method.

A front end module according to a preferred embodiment of the present invention that uses a carrier aggregation method in which communication is performed using a signal of a first frequency band that is selected from among multiple frequency bands and a signal of a second frequency band that is selected from among the multiple frequency bands and different from the first frequency band at the same time, includes a first antenna terminal and a second antenna terminal that are connected to an antenna element, a plurality of transmission terminals to which transmission signals are input, and a plurality of reception terminals that output reception signals; a plurality of signal paths that are disposed between the first antenna terminal and each of a corresponding one of the plurality of transmission terminals and a corresponding one of the plurality of reception terminals and between the second antenna terminal and each of a corresponding one of the plurality of transmission terminals and a corresponding one of the plurality of reception terminals, signals of corresponding frequency bands of the multiple frequency bands propagating through the plurality of signal paths, the plurality of signal paths including a first signal path and a second signal path; a switch module that includes the first antenna terminal, the second antenna terminal, and a plurality of selection terminals, is disposed between the antenna element and the plurality of signal paths, is capable of performing connection between the first antenna terminal and the first signal path and connection between the second antenna terminal and the second signal path at the same time, and switches connection between the antenna element and the plurality of signal paths; and a balanced/unbalanced conversion element that is disposed at the first signal path through which a signal of the first frequency band propagates or the second signal path through which a signal of the second frequency band propagates, of the plurality of signal paths, and includes an unbalanced terminal, a first balanced terminal, and a second balanced terminal. A frequency of a fundamental wave or a harmonic of a transmission signal of the first frequency band at least partially overlaps with a frequency of a signal of the second frequency band. The first balanced terminal and the second balanced terminal are connected to a first selection terminal and a second selection terminal, respectively, of the plurality of selection terminals. The balanced/unbalanced conversion element causes the fundamental wave or the harmonic that is input through the unbalanced terminal to branch into branch signals with opposite phases and outputs the branch signals to the first balanced terminal and the second balanced terminal.

With the above-described configuration, in the case in which signals of the first frequency band and the second frequency band are subjected to a CA operation, for example, a fundamental wave or harmonic component of the first frequency band passing through the first signal path and the switch module and propagating to the second signal path and a fundamental wave or harmonic component of the first frequency band passing through the balanced/unbalanced conversion element and the switch module and propagating to the second signal path have opposite phases, and thus cancel each other out. Therefore, with the CA method, excellent isolation characteristics between multiple frequency bands are able to be ensured. Furthermore, a harmonic component of a transmission signal of the first frequency band being superimposed on a reception signal of the second frequency band is able to be reduced or prevented, and the reception sensitivity of the front end module is thus improved.

Furthermore, the balanced/unbalanced conversion element may be disposed at the first signal path. In a case in which a signal of the first frequency band and a signal of the second frequency band are subjected to a carrier aggregation operation, at least one of the first selection terminal and the second selection terminal may be connected to neither the first antenna terminal nor the second antenna terminal.

With the above-described configuration, in the case in which signals of the first frequency band and the second frequency band are subjected to a CA operation, a fundamental wave or harmonic component of the first frequency band that is going to pass through the first signal path and then the switch module and flow into the second signal path is able to be canceled out in the switch module by a fundamental wave or harmonic component of the first frequency band passing through the balanced/unbalanced conversion element and then the switch module. Thus, with the CA method, a fundamental wave or harmonic component of the first frequency band is able to be prevented from intruding into the second signal path. Therefore, excellent isolation characteristics between multiple frequency bands are able to be ensured, and the reception sensitivity of the second frequency band is thus improved.

Furthermore, the balanced/unbalanced conversion element may be disposed at the second signal path. The plurality of signal paths may include a third signal path. In a case in which the first signal path through which a signal of the first frequency band propagates and the third signal path through which a signal of the second frequency band propagates are subjected to a carrier aggregation operation, the first selection terminal and the second selection terminal may be connected to neither the first antenna terminal nor the second antenna terminal.

With the above-described configuration, in the case in which signals of the first frequency band and the second frequency band are subjected to a CA operation, a fundamental wave or harmonic component of the first frequency band intruding into the second signal path from the first signal path is caused, by the balanced/unbalanced conversion element disposed at the second signal path, to branch into two branch signals with opposite phases. In the case in which the first signal path through which a signal of the first frequency band propagates and the third signal path through which a signal of the second frequency band propagates are subjected to a CA operation, the two branch signals are not connected to the second signal path in the switch module. Accordingly, a fundamental wave or harmonic component of the first frequency band that would intrude into the second signal path and flow into the third signal path is caused to branch into two branch signals having opposite phases, and the two branch signals cancel each other out in the switch module. Therefore, with the CA method, a fundamental wave or harmonic component of the first frequency band is able to be prevented from intruding into the third signal path. Thus, excellent isolation characteristics between multiple frequency bands are able to be ensured, and the reception sensitivity of the third frequency band is thus improved.

Furthermore, the balanced/unbalanced conversion element may be a filter element for which the second frequency band is defined as a pass band.

With the above-described configuration, the balanced/unbalanced conversion element is also used as a band pass filter disposed at the second signal path. Therefore, lower loss in the second signal path, a decrease in the number of components, and miniaturization are able to be achieved.

Furthermore, transmission and reception signals of Band 8 based on LTE (Long Term Evolution) standards (transmission band: about 880 MHz to about 915 MHz, reception band: about 925 MHz to about 960 MHz) may propagate through the first signal path. A transmission signal of GSM®_HB (transmission band: about 1710 MHz to about 1910 MHz) may propagate through the second signal path. A high-frequency signal of Band 3 based on the LTE standards (transmission band: about 1710 MHz to about 1785 MHz, reception band: about 1805 MHz to about 1880 MHz) may propagate through the third signal path.

Accordingly, in a multiband/multimode system that includes the Band 3 and the Band 8 based on the LTE standards supporting 3G/4G and GSM® supporting 2G, a CA operation in which a degradation in the reception sensitivity is able to be reduced or prevented is achieved.

Furthermore, a front end module according to a preferred embodiment of the present invention that uses a carrier aggregation method in which communication is performed using a signal of a first frequency band that is selected from among multiple frequency bands and a signal of a second frequency band that is selected from among the multiple frequency bands and different from the first frequency band at the same time, includes a first antenna terminal and a second antenna terminal that are connected to an antenna element, a plurality of transmission terminals to which transmission signals are input, and a plurality of reception terminals that output reception signals; a plurality of signal paths that are disposed between the first antenna terminal and each of a corresponding one of the plurality of transmission terminals and a corresponding one of the plurality of reception terminals and between the second antenna terminal and each of a corresponding one of the plurality of transmission terminals and a corresponding one of the plurality of reception terminals, signals of corresponding frequency bands of the multiple frequency bands propagating through the plurality of signal paths, the plurality of signal paths including a first signal path and a second signal path; a switch module that includes the first antenna terminal, the second antenna terminal, and a plurality of selection terminals, is disposed between the antenna element and the plurality of signal paths, is capable of performing connection between the first antenna terminal and the first signal path and connection between the second antenna terminal and the second signal path at the same time, and switches connection between the antenna element and the plurality of signal paths; and a balanced/unbalanced conversion element that is disposed at the second signal path through which a signal of the second frequency band propagates, of the plurality of signal paths, and includes a first balanced terminal, a second balanced terminal, and an unbalanced terminal that is connected to a reception terminal for the second frequency band. A frequency of a fundamental wave or harmonic of a transmission signal of the first frequency band at least partially overlaps with that of a signal of the second frequency band. The balanced/unbalanced conversion element converts the fundamental waves or harmonics that pass through the first signal path through which a signal of the first frequency band propagates and the switch module and are input to the first balanced terminal and the second balanced terminal to have opposite phases and combines the converted fundamental waves or harmonics.

With the above-described configuration, in the case in which signals of the first frequency band and the second frequency band are subjected to a CA operation, a fundamental wave or harmonic component of the first frequency band passing through the first signal path and the switch module and propagating to the second signal path is able to be input to the first balanced terminal and the second balanced terminal of the balanced/unbalanced conversion element arranged at the second signal path. Then, the balanced/unbalanced conversion element converts the fundamental wave or harmonic components input to the first balanced terminal and the second balanced terminal to have opposite phases and combines the converted fundamental wave or harmonic components together. That is, in the case in which signals of the first frequency band and the second frequency band are subjected to a CA operation, fundamental wave or harmonic components that have passed through the first signal path and then the switch module and flowed into the second signal path are able to be canceled out by the balanced/unbalanced conversion element at the second signal path. Therefore, excellent isolation characteristics between multiple frequency bands are able to be ensured, and the reception sensitivity of the second frequency band is thus improved.

Furthermore, the plurality of signal paths may include a fourth signal path. The balanced/unbalanced conversion element may be a filter element for which the second frequency band is defined as a pass band. The first balanced terminal and the second balanced terminal may be connected to a first selection terminal and a second selection terminal, respectively, of the plurality of selection terminals. The switch module may include a phase inversion element that inverts a phase of a high-frequency reception signal of the second frequency band propagating from the second antenna terminal to the first selection terminal. In a case in which the first signal path and the second signal path are subjected to a carrier aggregation operation, by connecting the first selection terminal and the second selection terminal to the second antenna terminal, a reception signal of the second frequency band may pass through the balanced/unbalanced conversion element, and the balanced/unbalanced conversion element may convert the fundamental waves or harmonics that pass through the fourth signal path through which a signal of the second frequency band propagates and the switch module and are input to the first balanced terminal and the second balanced terminal to have opposite phases, so that the converted fundamental waves or harmonics cancel each other out.

Accordingly, in the case in which signals of the first frequency band and the second frequency band are subjected to a CA operation, a fundamental wave or harmonic component of the first frequency band intruding into the fourth signal path through which a signal of the second frequency band propagates from the first signal path, passing through the switch module, and flowing into the second signal path is able to be input to the first balanced terminal and the second balanced terminal of the balanced/unbalanced conversion element disposed at the second signal path. Therefore, the fundamental wave or harmonic components that have passed through the first signal path, the fourth signal path, and then the switch module and flowed into the second signal path are able to be canceled out by the balanced/unbalanced conversion element at the second signal path. Thus, excellent isolation characteristics between multiple frequency bands are able to be ensured, and the reception sensitivity of the second frequency band is thus improved. Furthermore, the balanced/unbalanced conversion element is also used as a band pass filter disposed at the second signal path. Therefore, lower loss in the second signal path, a decrease in the number of components, and miniaturization are able to be achieved.

Furthermore, transmission and reception signals of Band 8 based on LTE standards (transmission band: about 880 MHz to about 915 MHz, reception band: about 925 MHz to about 960 MHz) may propagate through the first signal path. Transmission and reception signals of Band 3 based on the LTE standards (transmission band: about 1710 MHz to about 1785 MHz, reception band: about 1805 MHz to about 1880 MHz) may propagate through the second signal path. A transmission signal of GSM®_HB (transmission band: about 1710 MHz to about 1910 MHz) may propagate through the fourth signal path.

Accordingly, in a multiband/multimode system that includes the Band 3 and the Band 8 based on the LTE standards supporting 3G/4G and GSM® supporting 2G, a CA operation in which a degradation in the reception sensitivity is able to be reduced or prevented is achieved.

Furthermore, a front end module according to a preferred embodiment of the present invention that uses a carrier aggregation method in which communication is performed using a signal of a first frequency band that is selected from among multiple frequency bands and a signal of a second frequency band that is selected from among the multiple frequency bands and different from the first frequency band at the same time, includes a first antenna terminal and a second antenna terminal that are connected to an antenna element, a plurality of transmission terminals to which transmission signals are input, and a plurality of reception terminals that output high-frequency reception signals; a plurality of signal paths that are disposed between the first antenna terminal and each of a corresponding one of the plurality of transmission terminals and a corresponding one of the plurality of reception terminals and between the second antenna terminal and each of a corresponding one of the plurality of transmission terminals and a corresponding one of the plurality of reception terminals, signals of corresponding frequency bands of the multiple frequency bands propagating through the plurality of signal paths, the plurality of signal paths including a first signal path and a second signal path; a switch module that includes the first antenna terminal, the second antenna terminal, and a plurality of selection terminals, is disposed between the antenna element and the plurality of signal paths, is capable of performing connection between the first antenna terminal and the first signal path and connection between the second antenna terminal and the second signal path at the same time, and switches connection between the antenna element and the plurality of signal paths; an electric power detection coupler that is disposed between the first antenna terminal and the antenna element; and a phase inversion element that includes an input terminal and an output terminal, the input terminal being connected to the electric power detection coupler, the output terminal being connected to a reception terminal for the second frequency band. A frequency of a fundamental wave or harmonic of a transmission signal of the first frequency band partially overlaps with a signal of the second frequency band. The phase inversion element receives the fundamental wave or harmonic of the transmission signal of the first frequency band that has passed through the electric power detection coupler, inverts a phase of the fundamental wave or harmonic, and outputs the phase-inverted fundamental wave or harmonic.

With the above-described configuration, in the case in which signals of the first frequency band and the second frequency band are subjected to a CA operation, a fundamental wave or harmonic component of the first frequency band passing through the first signal path and the switch module and propagating to the second signal path and a fundamental wave or harmonic component of the first frequency band passing through the first signal path, the switch module, the electric power detection coupler, and the phase inversion element and input to the second signal path have opposite phases, and thus cancel each other out. Therefore, with the CA method, excellent isolation characteristics between multiple frequency bands are able to be achieved. Furthermore, a harmonic component of a transmission signal of the first frequency band being superimposed on a reception signal of the second frequency band is able to be reduced or prevented, and the reception sensitivity of the front end module is thus improved. Furthermore, there is no need to provide a phase inversion element to cancel out fundamental wave or harmonic components of the first frequency band at the first signal path and the second signal path. Therefore, propagation loss of signals of the first frequency band and the second frequency band is able to be reduced.

Furthermore, the front end module may further include a first duplexer that is disposed at the first signal path, a transmission signal and a reception signal of the first frequency band passing through the first duplexer; and a second duplexer that is disposed at the second signal path, a transmission signal and a reception signal of the second frequency band passing through the second duplexer.

With the above-described configuration, in the front end module that transmits and receives high-frequency signals of bands by a frequency division duplexing (FDD) method, excellent isolation characteristics between multiple frequency bands are able to be ensured in a CA operation, and the reception sensitivity is thus improved.

Furthermore, the front end module may further include a first amplification circuit that is connected to a transmission terminal for the first signal path and amplifies a transmission signal of the first frequency band in advance; and a second amplification circuit that is connected to a transmission terminal for the second signal path and amplifies a transmission signal of the second frequency band in advance.

With the above-described configuration, in the front end module that includes a power amplifier that amplifies a transmission signal, excellent isolation characteristics between multiple frequency bands are able to be ensured in a CA operation, and the reception sensitivity is thus improved.

Furthermore, a communication apparatus according to a preferred embodiment of the present invention includes an RF signal processing circuit that processes a high-frequency signal transmitted and received at the antenna element; and a front end module described above that transmits the high-frequency signal between the antenna element and the RF signal processing circuit.

With the above-described configuration, a communication apparatus, with a CA method, having excellent isolation characteristics between multiple frequency bands and improved reception sensitivity is able to be provided.

With front end modules or communication apparatuses according to preferred embodiments of the present invention, excellent isolation characteristics between multiple frequency bands are able to be ensured in a carrier aggregation method.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
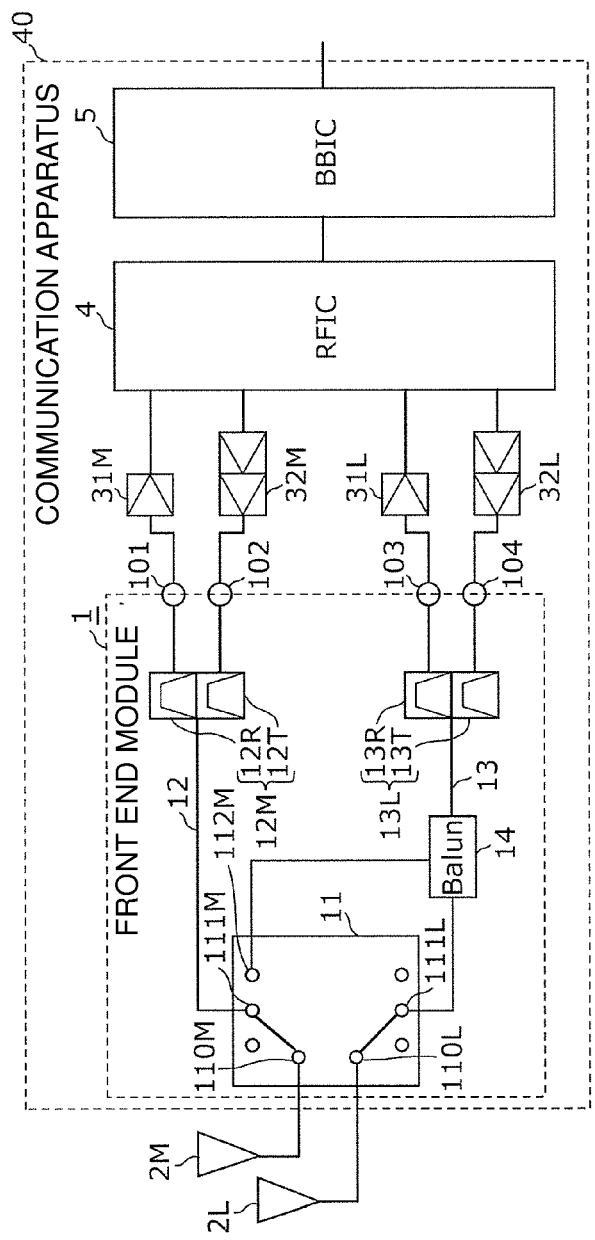
FIG. 1 is a circuit configuration diagram of a front end module and a communication apparatus according to a first preferred embodiment of the present invention.

Preferred embodiments of the present invention will be described in detail with reference to the accompanying drawings. The preferred embodiments described herein illustrate either general or specific examples. Numerical values, shapes, materials, components, and arrangements and structures of connections of the components described in the preferred embodiments are merely examples, and are not intended to limit the present invention. Components in the preferred embodiments, except those described in the independent claims, will be explained as optional components. The sizes or the ratios between the sizes of the components illustrated in the drawings are not strictly accurate.

First Preferred Embodiment

FIG. 1 is a circuit configuration diagram of a front end module 1 and a communication apparatus 40 according to a first preferred embodiment. In FIG. 1, antenna elements 2L and 2M connected to the communication apparatus 40 are also illustrated. The communication apparatus 40 includes the front end module 1, a high-frequency amplification circuit, an RF signal processing circuit (RFIC) 4, and a baseband signal processing circuit (BBIC) 5. The high-frequency amplification circuit includes low-noise amplifiers 31L and 31M and power amplifiers 32L and 32M.

The RF signal processing circuit 4 performs signal processing, by down-conversion, for example, on high-frequency reception signals input from the antenna elements 2L and 2M through signal paths 12 and 13, and outputs reception signals generated by the signal processing to the baseband signal processing circuit 5. The RF signal processing circuit 4 is preferably, for example, an RFIC.

A signal processed by the baseband signal processing circuit 5 is used, for example, as an image signal for image display or as a sound signal for conversation.

The front end module 1 is a multi-carrier transmission and reception device in which a plurality of signal paths through which wireless signals are transmitted and received in multiple frequency bands are provided so that multiple modes and multiple bands are able to be supported. The front end module 1 includes a switch module 11, the signal paths 12 and 13, duplexers 12M and 13L, a balun 14, reception terminals 101 and 103, and transmission terminals 102 and 104. The front end module 1 is provided, for example, at a front end of a cellular phone supporting multiple modes and multiple bands.

The signal path 13 is a first signal path between the switch module 11 and each of the transmission terminal 104 and the reception terminal 103. A signal of a corresponding first frequency band of multiple frequency bands propagates through the signal path 13.

The signal path 12 is a second signal path between the switch module 11 and each of the transmission terminal 102 and the reception terminal 101. A signal of a corresponding second frequency band of multiple frequency bands propagates through the signal path 12. Here, the second frequency band is higher than the first frequency band.

In the signal paths 12 and 13, signal processing is performed by a frequency division duplexing (FDD) method. Therefore, the duplexers 12M and 13L that enable simultaneous transmission and reception are disposed at the signal paths 12 and 13, respectively. For a signal path in which signal processing is performed by a time division duplexing (TDD) method, no duplexer may be provided.

The duplexer 12M includes a transmission-side filter 12T for which the transmission band of the second frequency band is defined as the pass band and a reception-side filter 12R for which the reception band of the second frequency band is defined as the pass band.

The duplexer 13L includes a transmission-side filter 13T for which the transmission band of the first frequency band is defined as the pass band and a reception-side filter 13R for which the reception band of the second frequency band is defined as the pass band.

Transmission paths (Tx) of the signal paths 12 and 13 are connected to the power amplifier 32M (a second amplification circuit) and the power amplifier 32L (a first amplification circuit) to amplify transmission signals in advance, with the transmission terminals 102 and 104 interposed therebetween, respectively. Furthermore, reception paths (Rx) of the signal paths 12 and 13 are connected to the low-noise amplifiers 31M and 31L with the reception terminals 101 and 103 interposed therebetween, respectively.

In the present preferred embodiment, preferably, for example, Band 8 based on LTE (Long Term Evolution) standards (transmission band: about 880 MHz to about 915 MHz, reception band: about 925 MHz to about 960 MHz) is applied to the first frequency band. Furthermore, for example, Band 3 based on the LTE standards (transmission band: about 1710 MHz to about 1785 MHz, reception band: about 1805 MHz to about 1880 MHz) is preferably applied to the second frequency band.

A configuration of the front end module 1 according to the present preferred embodiment including the signal paths 13 and 12 corresponding to two bands: the first frequency band and the second frequency band, has been described above.

However, the front end module 1 may include signal paths different from the two signal paths 13 and 12. For example, in the case in which the first frequency band is a band belonging to a low-frequency band (low band) group and the second frequency band is a band belonging to a middle-frequency band (middle band) group or a high-frequency band (high band) group, the front end module 1 may include signal paths corresponding to a band belonging to the low-frequency band group and different from the first frequency band and a band belonging to the middle-frequency band or the high-frequency band group and different from the second frequency band.

To improve communication quality, the front end module 1 according to the present preferred embodiment performs a carrier aggregation (CA) method that uses different frequency bands at the same time. That is, the front end module 1 performs communication using a first frequency band that is selected from among frequency bands belonging to the first frequency band group (for example, a low band group) and a second frequency band that is selected from among frequency bands belonging to the second frequency band group (for example, a middle band group) at the same time. That is, CA operation is performed.

The balun 14 is a balanced/unbalanced conversion element that is disposed at the signal path 13 and includes an unbalanced terminal, a first balanced terminal, and a second balanced terminal. The balun 14 causes a high-frequency signal input from the unbalanced terminal to branch out into branch signals having opposite phases and outputs the branch signals to the first balanced terminal and the second balanced terminal. The unbalanced terminal of the balun 14 is connected to a common terminal of the duplexer 13L, and the first balanced terminal and the second balanced terminal are connected to the switch module 11.

The antenna element 2L emits a high-frequency signal of the first frequency band group (for example, a low band group) into space and receives a spatially-propagated high-frequency signal of the first frequency band group. The antenna element 2M emits a high-frequency signal of the second frequency band group (for example, a middle band group) into space and receives a spatially-propagated high-frequency signal of the second frequency band group.

The switch module 11 enables connection between the antenna elements 2L and 2M and at least two signal paths of the plurality of signal paths, so that connection between the antenna elements 2L and 2M and the plurality of signal paths is able to be switched. The switch module 11 includes an antenna terminal 110L connected to the antenna element 2L, an antenna terminal 110M connected to the antenna element 2M, a selection terminal 111M, a selection terminal 112M, and a selection terminal 111L. The selection terminal 111M is connected to the signal path 12, the selection terminal 112M is connected to the second balanced terminal of the balun 14, and the selection terminal 111L is connected to the first balanced terminal of the balun 14. The antenna terminals 110M and 110L correspond to a second antenna terminal and a first antenna terminal, respectively, of the front end module 1.

With the above-described connection configuration of the balun 14, the antenna elements 2L and 2M, and the switch module 11, the antenna element 2L selects between connection and non-connection with the signal path 13, and the antenna element 2M selects between connection and non-connection with the signal path 12. The antenna elements 2M and 2L are not connected to the second balanced terminal of the balun 14. In the case in which a high-frequency signal of the first frequency band propagating through the signal path 13 and a high-frequency signal of the second frequency band propagating through the signal path 12 are subjected to a CA operation, the antenna terminal 110L is connected to the selection terminal 111L, and the antenna terminal 110M is connected to the selection terminal 111M.

The antenna elements 2L and 2M connected to the front end module 1 according to the present preferred embodiment may be a single antenna element. In this case, the antenna terminals 110L and 110M of the switch module 11 may be a single antenna terminal, and the antenna terminal may be connected to two or more selection terminals at the same time.

The configuration of the switch module 11 is not limited to the configuration described above.

Figure 2:
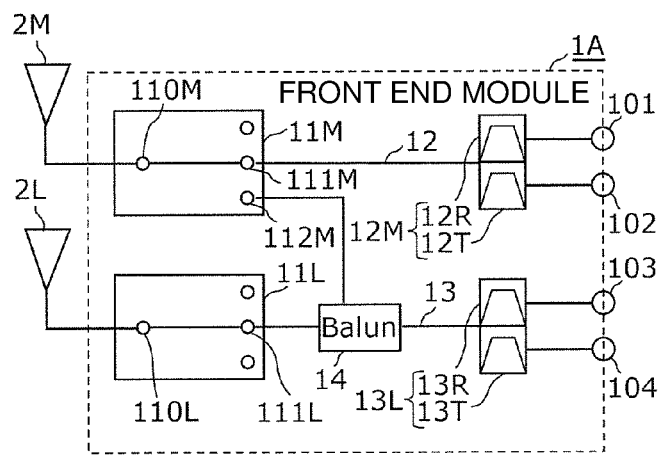
FIG. 2 is a circuit configuration diagram of a front end module according to a first modification of the first preferred embodiment of the present invention.

FIG. 2 is a circuit configuration diagram of a front end module 1A according to a first modification of the first preferred embodiment. The front end module 1A illustrated in FIG. 2 is different from the front end module 1 described above only in the configuration of the switch module. The front end module 1A according to the present modification includes switches 11L and 11M, the signal paths 12 and 13, the duplexers 12M and 13L, the balun 14, the reception terminals 101 and 103, and the transmission terminals 102 and 104.

The switch 11L switches connection between the antenna element 2L and the signal path 13, and includes the antenna terminal 110L connected to the antenna element 2L and the selection terminal 111L. By being connected to the first balanced terminal of the balun 14, the selection terminal 111L is connected to the signal path 13.

The switch 11M switches connection between the antenna element 2M and the signal path 12, and includes the antenna terminal 110M connected to the antenna element 2M, the selection terminal 111M, and the selection terminal 112M. The selection terminal 111M is connected to the signal path 12, and the selection terminal 112M is connected to the second balanced terminal of the balun 14.

The front end module 1 according to the present preferred embodiment and the front end module 1A according to the present modification have similar advantageous effects explained below.

Figure 3:
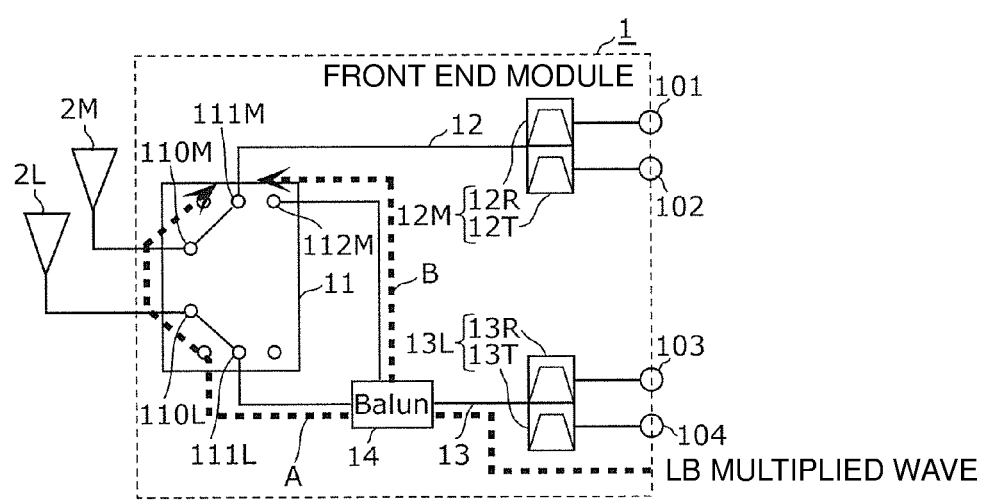
FIG. 3 is a diagram illustrating the circuit configuration and the flow of signals in the front end module according to the first preferred embodiment of the present invention.

FIG. 3 is a diagram illustrating the circuit configuration and the flow of signals in the front end module 1 according to the first preferred embodiment. In the front end module 1, a transmission signal of a first frequency band passes through the transmission terminal 104, the transmission-side filter 13T, the signal path 13, and the switch module 11 in that order, and is emitted through the antenna element 2L. At this time, in the case in which the frequency of a fundamental wave or harmonic (multiplied wave) of a transmission signal of the first frequency band falls within the second frequency band, the fundamental wave or harmonic of the transmission signal of the first frequency band will pass through the transmission-side filter 13T, the signal path 13, and the selection terminal 111L, the antenna terminal 110L, the antenna terminal 110M, and the selection terminal 111M within the switch module 11 in that order and flow into the signal path 12.

In the case in which the first frequency band is the Band 8 and the second frequency band is the Band 3, the frequency of a second harmonic component of a transmission signal of the Band 8 (transmission band: about 880 MHz to about 915 MHz) falls within the reception band of the Band 3 (about 1805 MHz to about 1880 MHz).

In conventional front end modules, due to a fundamental wave or harmonic of a transmission signal of the first frequency band flowing into the second signal path, the reception sensitivity of a reception signal of the second frequency band is degraded.

In contrast, with the front end module 1 according to the present preferred embodiment, in the case in which a high-frequency signal of the first frequency band propagating through the signal path 13 and a high-frequency signal of the second frequency band propagating through the signal path 12 are subjected to a CA operation, for example, a fundamental wave or harmonic component of the first frequency band that will pass through the signal path 13 and the switch module 11 and flow into the signal path 12 (a path A in FIG. 3) and a fundamental wave or harmonic component of the first frequency band that has passed through the balun 14 and the switch module 11 (a path B in FIG. 3) have opposite phases. Furthermore, the balun 14 is able to perform adjustment to achieve equal or substantially equal amplitude balance between the fundamental wave or harmonic component of the first frequency band propagating through the path A and the fundamental wave or harmonic component of the first frequency band propagating through the path B. Therefore, the fundamental wave or harmonic component of the first frequency band propagating through the path A and the fundamental wave or harmonic component of the first frequency band propagating through the path B cancel each other out within the switch module 11. Thus, with the CA method, fundamental wave or harmonic components of the first frequency band are able to be prevented from intruding into the signal path 12. Consequently, with the CA method, excellent isolation characteristics between the first frequency band and the second frequency band is able to be ensured, and the reception sensitivity of the second frequency band in the signal path 12 is improved.

Figure 4:
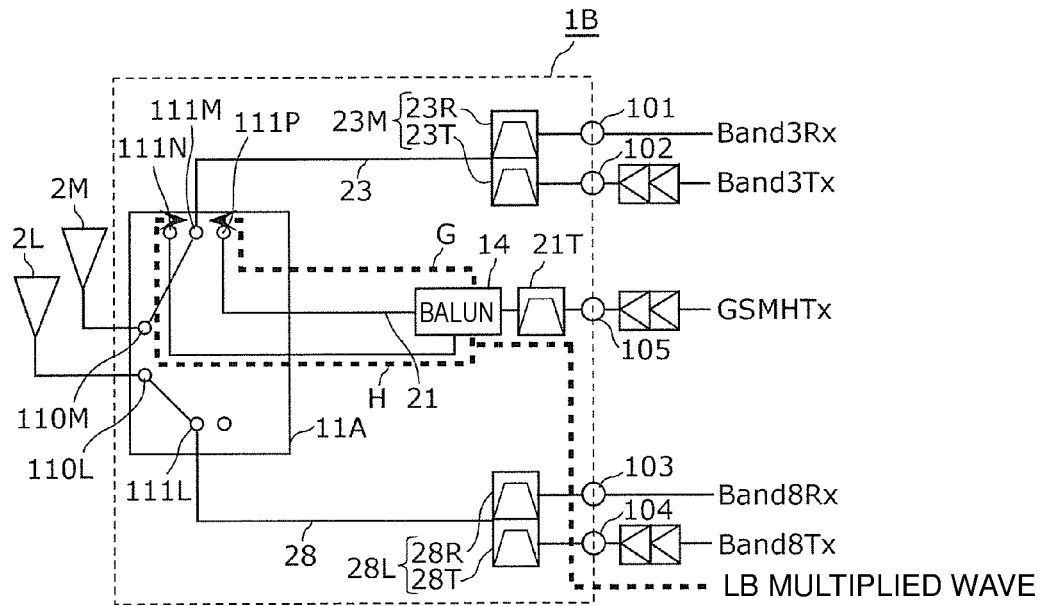
FIG. 4 is a diagram illustrating the circuit configuration and the flow of signals in a front end module according to a second modification of the first preferred embodiment of the present invention.

FIG. 4 is a diagram illustrating the circuit configuration and the flow of signals in a front end module 1B according to a second modification of the first preferred embodiment. The configuration of the front end module 1B illustrated in FIG. 4 is different from that of the front end module 1 according to the first preferred embodiment in that (1) two signal paths are provided for the second frequency band and (2) the balun 14 is provided at a signal path for the second frequency band. Explanation of features of the front end module 1B according to the present modification that are the same as or similar to those of the front end module 1 according to the first preferred embodiment will be omitted and differences will be mainly explained.

The front end module 1B includes a switch module 11A, signal paths 21, 23, and 28, duplexers 23M and 28L, a transmission filter 21T, the balun 14, the reception terminals 101 and 103, and transmission terminals 102, 104, and 105.

The signal path 28 is a first signal path between the switch module 11A and each of the transmission terminal 104 and the reception terminal 103, and a signal of a corresponding first frequency band of multiple frequency bands propagates through the signal path 28. In the present modification, preferably, for example, transmission and reception signals of the Band 8 based on the LTE standards (transmission band: about 880 MHz to about 915 MHz, reception band: about 925 MHz to about 960 MHz) propagate through the signal path 28.

The signal path 21 is a second signal path between the transmission terminal 105 and the switch module 11A. A signal of a corresponding second frequency band of multiple frequency bands propagates through the signal path 21. Here, the second frequency band is preferably higher than the first frequency band. In the present modification, preferably, for example, a transmission signal of a GSM® high band (GSM®_HB: transmission band: about 1710 MHz to about 1990 MHz) propagates through the signal path 21.

The signal path 23 is a third signal path between the switch module 11A and each of the transmission terminal 102 and the reception terminal 101. A signal of a corresponding second frequency band of multiple frequency bands propagates through the signal path 23. In the present modification, preferably, for example, transmission and reception signals of the Band 3 based on the LTE standards (transmission band: about 1710 MHz to about 1785 MHz, reception band: about 1805 MHz to about 1880 MHz) propagate through the signal path 23.

In the signal paths 23 and 28, signal processing is performed by the FDD method. Therefore, the duplexers 23M and 28L that enable simultaneous transmission and reception are disposed at the signal paths 23 and 28, respectively. For a signal path in which signal processing is performed by the TDD method, no duplexer may be provided.

In contrast, in the signal path 21, signal processing is performed by the TDD method. Therefore, no duplexer is provided at the signal path 21.

The duplexer 23M includes a transmission-side filter 23T for which the transmission band of the second frequency band is defined as the pass band and a reception-side filter 23R for which the reception band of the second frequency band is defined as the pass band.

The duplexer 28L includes a transmission-side filter 28T for which the transmission band of the first frequency band is defined as the pass band and a reception-side filter 28R for which the reception band of the second frequency band is defined as the pass band.

To improve communication quality, the front end module 1B according to the present modification performs CA that uses different frequency bands at the same time. That is, the front end module 1B according to the present modification performs communication using a first frequency band selected from among frequency bands belonging to a first frequency band group (for example, a low band group) and a second frequency band selected from among frequency bands belonging to a second frequency band group (for example, a middle band group) at the same time.

The balun 14 is a balanced/unbalanced conversion element that is disposed at the signal path 21 and includes an unbalanced terminal, a first balanced terminal, and a second balanced terminal. The balun 14 causes a high-frequency signal input from the unbalanced terminal to branch out into branch signals having opposite phases and outputs the branch signals to the first balanced terminal and the second balanced terminal. The unbalanced terminal of the balun 14 is connected to an output terminal of the transmission-side filter 21T, and the first balanced terminal and the second balanced terminal are connected to the switch module 11A.

The switch module 11A enables connection between the antenna elements 2L and 2M and at least two signal paths of the plurality of signal paths, so that connection between the antenna elements 2L and 2M and the plurality of signal paths is able to be switched. The switch module 11A includes the antenna terminal 110L connected to the antenna element 2L, the antenna terminal 110M connected to the antenna element 2M, the selection terminal 111M, a selection terminal 111P, a selection terminal 111N, and the selection terminal 111L. The selection terminal 111M is connected to the signal path 23, the selection terminal 111L is connected to the signal path 28, the selection terminal 111P is connected to the first balanced terminal of the balun 14, and the selection terminal 111N is connected to the second balanced terminal of the balun 14.

With the above-described connection configuration of the balun 14, the antenna elements 2L and 2M, and the switch module 11A, the antenna element 2L selects between (1) connection with the signal path 28 and (2) non-connection with the signal path 28. In contrast, the antenna element 2M selects between (1) connection with the signal path 23, (2) connection with the signal path 21, and (3) non-connection with the signal paths 21 and 23. In the case in which a high-frequency signal of the first frequency band propagating through the signal path 28 and a high-frequency signal of the second frequency band propagating through the signal path 23 are subjected to a CA operation, the antenna terminal 110L is connected to the selection terminal 111L, the antenna terminal 110M is connected to the selection terminal 111M, and the selection terminals 111P and 111N are not connected to any antenna terminal.

The antenna elements 2L and 2M connected to the front end module 1B according to the present modification may be a single antenna element. In this case, the antenna terminals 110L and 110M of the switch module 11 may be a single antenna terminal, and the single antenna terminal may be connected to two or more selection terminals at the same time.

As illustrated in FIG. 4, in the front end module 1B, a transmission signal of the first frequency band passes through the transmission terminal 104, the transmission-side filter 28T, the signal path 28, and the switch module 11A in that order, and is emitted through the antenna element 2L. At this time, in the case in which the frequency of a fundamental wave or harmonic (multiplied wave) of the transmission signal of the first frequency band partially overlaps with the second frequency band, the fundamental wave or harmonic of the transmission signal of the first frequency band will jump into the signal path 21 from the signal path 28, pass through the selection terminals 111P and 111M within the switch module 11A, and flow into the signal path 23.

In the case in which the first frequency band is the Band 8 and the second frequency band is the GSM®_HB and the Band 3, the frequency of a second harmonic component of a transmission signal of the Band 8 (transmission band: about 880 MHz to about 915 MHz) partially overlaps with the transmission band of the GSM®_HB (about 1710 MHz to about 1910 MHz) and the reception band of the Band 3 (about 1805 MHz to about 1880 MHz).

As a front end module according to a comparative example, a configuration is described in which the balun 14 is removed from the front end module 1B illustrated in FIG. 4. In the front end module according to the comparative example, in the case in which a high-frequency signal of a first frequency band propagating through the signal path 28 and a high-frequency of a second frequency band propagating through the signal path 23 are subjected to a CA operation, a fundamental wave or harmonic of a transmission signal of the first frequency band passes through the signal path 21 and flows into the signal path 23. Therefore, the reception sensitivity of a reception signal in the signal path 23 is degraded.

In contrast, with the front end module 1B according to the present modification, in the case in which a high-frequency signal of a first frequency band propagating through the signal path 28 and a high-frequency signal of a second frequency band propagating through the signal path 23 are subjected to a CA operation, a fundamental wave or harmonic component of the first frequency band that will jump into the signal path 21 from the signal path 28, pass through the switch module 11A, and flow into the signal path 23, passes through the balun 14, and is thus input to the switch module 11A as two branch signals having opposite phases (a path G and a path H in FIG. 4). Furthermore, the balun 14 is able to perform adjustment to achieve equal or substantially equal amplitude balance between the fundamental wave or harmonic component of the first frequency band propagating through the path G and the fundamental wave or harmonic component of the first frequency band propagating through the path H. Therefore, the fundamental wave or harmonic component of the first frequency band propagating through the path G and the fundamental wave or harmonic component of the first frequency band propagating through the path H cancel each other out within the switch module 11A. Thus, with the CA method, fundamental waves or harmonic components of the first frequency band are prevented from intruding into the signal path 23. Consequently, with the CA method, excellent isolation characteristics between the first frequency band and the second frequency band are able to be ensured, and the reception sensitivity of the second frequency band in the signal path 23 is improved.

In the case in which the GSM®_HB is selected as the second frequency band, the antenna terminal 110M is connected to the selection terminal 111P or 111N and the antenna terminal 110M is not connected to the selection terminal 111M, so that the antenna element 2M is able to be connected to the signal path 21. In this case, the balun 14 defines and functions as an impedance matching element for the switch module 11A and the transmission-side filter 21T.

Figure 5:
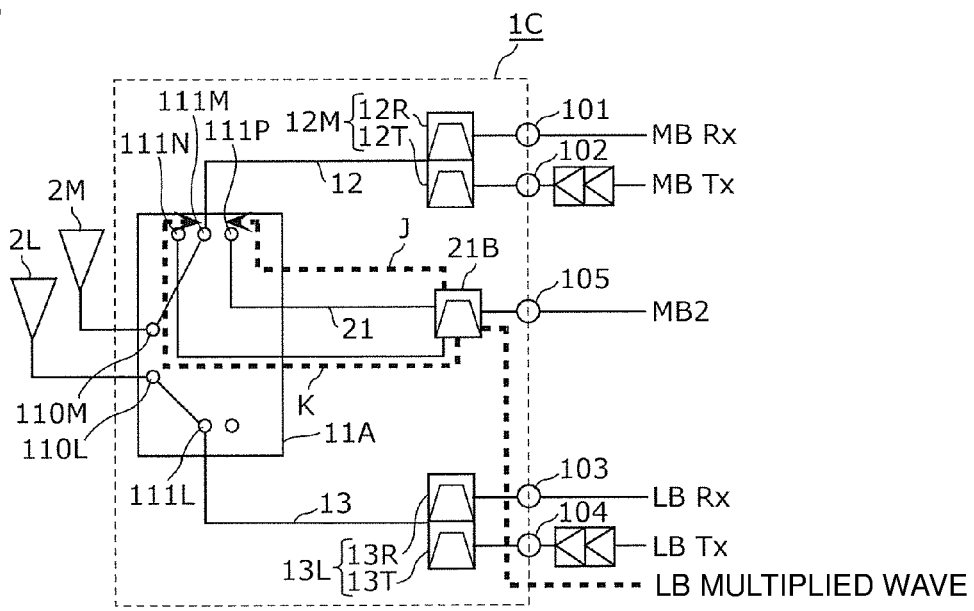
FIG. 5 is a diagram illustrating the circuit configuration and the flow of signals in a front end module according to a third modification of the first preferred embodiment of the present invention.

FIG. 5 is a diagram illustrating the circuit configuration and the flow of signals in a front end module 1C according to a third modification of the first preferred embodiment. The front end module 1C illustrated in FIG. 5 is different from the front end module 1B according to the second modification in that a filter 21B disposed at the signal path 21 is a balanced filter. Explanation of features of the front end module 1C according to the present modification that are the same as or similar to those of the front end module 1B according to the second modification will be omitted, and differences will be mainly explained.

The front end module 1C includes the switch module 11A, the signal paths 12, 13, and 21, the duplexers 12M and 13L, the filter 21B, the reception terminals 101 and 103, and the transmission terminals 102, 104, and 105.

The signal path 13 is a first signal path between the switch module 11A and each of the transmission terminal 104 and the reception terminal 103, and a signal of a corresponding first frequency band of multiple frequency bands propagates through the signal path 13.

The signal path 21 is a second signal path between the transmission terminal 105 and the switch module 11A, and a signal of a corresponding second frequency band of multiple frequency bands propagates through the second signal path. The second frequency band is preferably higher than the first frequency band.

The signal path 12 is a third signal path between the switch module 11A and each of the transmission terminal 102 and the reception terminal 101, and a signal of a corresponding second frequency band of multiple frequency bands propagates through the signal path 12.

In the signal paths 12 and 13, signal processing is performed by the FDD method, and therefore, the duplexers 12M and 13L that enable simultaneous transmission and reception are disposed at the signal paths 12 and 13, respectively. For a signal path in which signal processing is performed by the TDD method, no duplexer may be provided.

In contrast, the signal path 21 is only a transmission path, and no duplexer is provided at the signal path 21.

The duplexer 12M includes the transmission-side filter 12T for which the transmission band of the second frequency band is defined as the pass band and the reception-side filter 12R for which the reception band of the second frequency band is defined as the pass band.

The duplexer 13L includes the transmission-side filter 13T for which the transmission band of the first frequency band is defined as the pass band and the reception-side filter 13R for which the reception band of the second frequency band is defined as the pass band.

To improve communication quality, the front end module 1C according to the present modification performs CA that uses different frequency bands at the same time. That is, the front end module 1C performs communication using a first frequency band selected from among frequency bands belonging to a first frequency band group (for example, a low band group) and a second frequency band selected from among frequency bands belonging to a second frequency band group (for example, a middle band group) at the same time.

The filter 21B is a balanced/unbalanced conversion transmission-side filter that is disposed at the signal path 21 and includes an unbalanced terminal, a first balanced terminal, and a second balanced terminal. The filter 21B causes a high-frequency signal input from the unbalanced terminal to branch out into branch signals having opposite phases, and outputs the branch signals to the first balanced terminal and the second balanced terminal, and a transmission signal of the second frequency band passes through the filter 21B. The unbalanced terminal of the filter 21B is connected to the transmission terminal 105, and the first balanced terminal and the second balanced terminal are connected to the switch module 11A.

The signal path 21 may be a reception path. In this case, a high-frequency signal input from the unbalanced terminal is caused to branch out into branch signals having opposite phases, the branch signals are output to the first balanced terminal and the second balanced terminal, and reception signals of the second frequency band input from the first balanced terminal and the second balanced terminal pass through the signal path 21.

The selection terminal 111M of the switch module 11A is connected to the signal path 12, the selection terminal 111L is connected to the signal path 13, the selection terminal 111P is connected to the first balanced terminal of the filter 21B, and the selection terminal 111N is connected to the second balanced terminal of the filter 21B.

With the above-described connection configuration of the filter 21B, the antenna elements 2L and 2M, and the switch module 11A, the antenna element 2L selects between (1) connection with the signal path 13 and (2) non-connection with the signal path 13. In contrast, the antenna element 2M selects between (1) connection with the signal path 12, (2) connection with the signal path 21, and (3) non-connection with the signal paths 21 and 12. In the case in which a high-frequency signal of the first frequency band propagating through the signal path 13 and a high-frequency signal of the second frequency band propagating through the signal path 12 are subjected to a CA operation, the antenna terminal 110L is connected to the selection terminal 111L, the antenna terminal 110M is connected to the selection terminal 111M, and the selection terminals 111P and 111N are not connected to any antenna terminal.

The antenna elements 2L and 2M connected to the front end module 1C according to the present modification may be a single antenna element. In this case, the antenna terminals 110L and 110M of the switch module 11 may be a single antenna terminal, and the single antenna terminal may be connected to two or more selection terminals at the same time.

As illustrated in FIG. 5, in the front end module 1C, a transmission signal of the first frequency band passes through the transmission terminal 104, the transmission-side filter 13T, the signal path 13, and the switch module 11A in that order, and is emitted through the antenna element 2L. At this time, in the case in which the frequency of a fundamental wave or harmonic (multiplied wave) of the first frequency band falls within the second frequency band, the fundamental wave or harmonic of the transmission signal of the first frequency band will jump into the signal path 21 from the signal path 13, pass through the signal path 21 and the selection terminals 111P (or 111N) and 111M within the switch module 11A, and flow into the signal path 12.

With the front end module 1C according to the present modification, in the case in which a high-frequency signal of the first frequency band propagating through the signal path 13 and a high-frequency signal of the second frequency band propagating through the signal path 12 are subjected to a CA operation, a fundamental wave or harmonic component of the first frequency band that will jump into the signal path 21 from the signal path 13, pass through the switch module 11A, and flow into the signal path 12, passes through the filter 21B, and is thus input to the switch module 11A as two branch signals having opposite phases (a path J and a path K in FIG. 5). Furthermore, the filter 21B is able to perform adjustment to achieve equal or substantially equal amplitude balance between the fundamental wave or harmonic component of the first frequency band propagating through the path J and the fundamental wave or harmonic component of the first frequency band propagating through the path K. Therefore, the fundamental wave or harmonic component of the first frequency band propagating through the path J and the fundamental wave or harmonic component of the first frequency band propagating through the path K cancel each other out within the switch module 11A. Thus, with the CA method, fundamental wave or harmonic components of the first frequency band are prevented from intruding into the signal path 12. Consequently, with the CA method, excellent isolation characteristics between the first frequency band and the second frequency band are able to be ensured, and the reception sensitivity of the second frequency band in the signal path 12 is improved. Furthermore, the filter 21B is also used as a band pass filter disposed at the signal path 21, and lower loss in the signal path 21, a decrease in the number of components, and miniaturization are able to be achieved.

In the case in which the signal path 21 is selected as the second frequency band, the antenna terminal 110M is connected to the selection terminal 111P or 111N and the antenna terminal 110M is not connected to the selection terminal 111M, so that the antenna element 2M is able to be connected to the signal path 21.

Second Preferred Embodiment

In the first preferred embodiment, a configuration in which a balanced/unbalanced conversion element is disposed at a first signal path so that a fundamental wave or harmonic component of a first frequency band is prevented from intruding into a second signal path and a configuration in which a balanced/unbalanced conversion element is disposed at a second signal path so that a fundamental wave or harmonic component of a first frequency band is prevented from intruding into a third signal path have been described.

In a second preferred embodiment of the present invention, a configuration in which a balanced/unbalanced conversion element is disposed at a second signal path so that fundamental wave or harmonic components of a first frequency band cancel each other out at the second signal path will be described. Explanation of features of a front end module 1D according to a second preferred embodiment that are the same as or similar to those of the front end module 1 according to the first preferred embodiment will be omitted, and different configuration features will be mainly explained.

Figure 6:
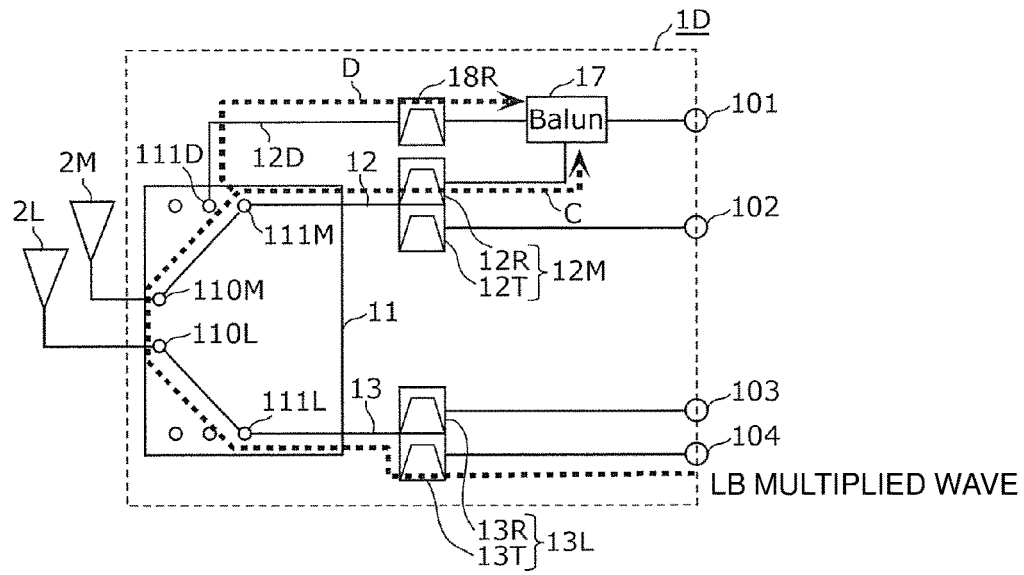
FIG. 6 is a diagram illustrating the circuit configuration and the flow of signals in a front end module according to a second preferred embodiment of the present invention.

FIG. 6 is a diagram illustrating the circuit configuration and the flow of signals in the front end module 1D according to the second preferred embodiment.

The front end module 1D includes the switch module 11, the signal paths 12 and 13, a sub-path 12D, the duplexers 12M and 13L, a balun 17, a filter 18R, the reception terminals 101 and 103, and the transmission terminals 102 and 104.

The balun 17 is a balanced/unbalanced conversion element that is disposed at a reception path of the signal path 12 and includes an unbalanced terminal, a first balanced terminal, and a second balanced terminal. The balun 17 converts high-frequency signals input to the first balanced terminal and the second balanced terminal to have opposite phases, combines the converted high-frequency signals, and outputs the combined signal through the unbalanced terminal. The unbalanced terminal of the balun 17 is connected to the reception terminal 101. The first balanced terminal is connected to an output terminal of the reception-side filter 12R, which defines and functions as the duplexer 12M. The second balanced terminal is connected to an output terminal of the filter 18R.

The sub-path 12D is between the switch module 11 and the reception terminal 101, and a signal causing fundamental wave or harmonic components of the first frequency band flowing into the signal path 12 to cancel each other out at the balun 17 flows through the sub-path 12D.

The filter 18R is disposed at the sub-path 12D and has filter characteristics equivalent to those of the reception-side filter 12R.

The switch module 11 enables connection between the antenna elements 2L and 2M and at least two signal paths of the plurality of signal paths, so that connection between the antenna elements 2L and 2M and the plurality of signal paths is able to be switched. The switch module 11 includes the antenna terminal 110L connected to the antenna element 2L, the antenna terminal 110M connected to the antenna element 2M, the selection terminal 111M, the selection terminal 111L, and a selection terminal 111D. The selection terminal 111M is connected to the signal path 12, the selection terminal 111L is connected to the signal path 13, and the selection terminal 111D is connected to the sub-path 12D. The antenna terminals 110M and 110L correspond to an antenna terminal of the front end module 1D.

With the above-described connection configuration of the sub-path 12D, the balun 17, the antenna elements 2L and 2M, and the switch module 11, the antenna element 2L selects between connection and non-connection with the signal path 13, and the antenna element 2M selects between connection and non-connection with the signal path 12. The antenna elements 2M and 2L are not connected to the sub-path 12D. In the case in which a high-frequency signal of the first frequency band propagating through the signal path 13 and a high-frequency signal of the second frequency band propagating through the signal path 12 are subjected to a CA operation, the antenna terminal 110L is connected to the selection terminal 111L, and the antenna terminal 110M is connected to the selection terminal 111M.

The antenna elements 2L and 2M connected to the front end module 1D according to the present preferred embodiment may be a single antenna element. In this case, the antenna terminals 110L and 110M of the switch module 11 may be a single antenna terminal, and the single antenna terminal may be connected to two or more selection terminals at the same time.

As illustrated in FIG. 6, in the front end module 1D, a transmission signal of the first frequency band passes through the transmission terminal 104, the transmission-side filter 13T, the signal path 13, and the switch module 11 in that order, and is emitted through the antenna element 2L. At this time, in the case in which the frequency of a fundamental wave or harmonic (multiplied wave) of the transmission signal of the first frequency band falls within the second frequency band, the fundamental wave or harmonic of the transmission signal of the first frequency band passes through the transmission-side filter 13T, the signal path 13, and the selection terminal 111L, the antenna terminal 110L, the antenna terminal 110M, and the selection terminal 111M within the switch module 11, and flows into the signal path 12.

As a front end module according to a comparative example, a configuration is described in which the balun 17, the filter 18R, and the sub-path 12D are removed from the front end module 1D illustrated in FIG. 6. In the front end module according to the comparative example, in the case in which a high-frequency signal of a first frequency band propagating through the signal path 13 and a high-frequency signal of a second frequency band propagating through the signal path 12 are subjected to a CA operation, a fundamental wave or harmonic of a transmission signal of the first frequency band flows into a second signal path and then flows into the low-noise amplifier 31M connected to a stage subsequent to the reception terminal 101. Therefore, the reception sensitivity of a reception signal of the second frequency band is degraded.

In contrast, with the front end module 1D according to the present preferred embodiment, in the case in which a high-frequency signal of the first frequency band propagating through the signal path 13 and a high-frequency signal of the second frequency band propagating through the signal path 12 are subjected to a CA operation, a fundamental wave or harmonic component of the first frequency band passing through the signal path 13 and the selection terminal 111M of the switch module 11 and flowing into the signal path 12 (a path C in FIG. 6) and a fundamental wave or harmonic component of the first frequency band passing through the signal path 13 and the selection terminal 111D of the switch module 11 and flowing into the sub-path 12D (a path D in FIG. 6) pass through the reception-side filter 12R and the filter 18R, and are input to the first balanced terminal and the second balanced terminal of the balun 17. Then, the balun 17 converts the fundamental wave or harmonic components input to the first balanced terminal and the second balanced terminal to have opposite phases, and combines the converted fundamental wave or harmonic components. That is, in the case in which signals of the first frequency band and the second frequency band are subjected to a CA operation, the fundamental wave or harmonic components of the first frequency band that have passed through the signal path 13 and the switch module 11 and flowed into the signal path 12 are canceled out by the balun 17 at the reception path of the signal path 12. Therefore, excellent isolation characteristics between multiple frequency bands are able to be ensured, and the reception sensitivity of the second frequency band is improved.

Furthermore, with the front end module 1D according to the present preferred embodiment, propagation loss of transmission and reception signals of the first frequency band propagating through the signal path 13 are able to further be reduced, compared to the front end module 1 according to the first preferred embodiment.

In the front end module 1D according to the present preferred embodiment, the balun 17 is disposed at the reception path of the signal path 12. However, the balun 17 may be disposed between the selection terminal 111M and the reception-side filter 12R. That is, the balun 17 may be disposed on the transmission and reception paths of the signal path 12. In this case, the sub-path 12D is connected to the selection terminal 111D and the second balanced terminal of the balun 17. Furthermore, in this case, the filter 18R is not necessary.

Figure 7:
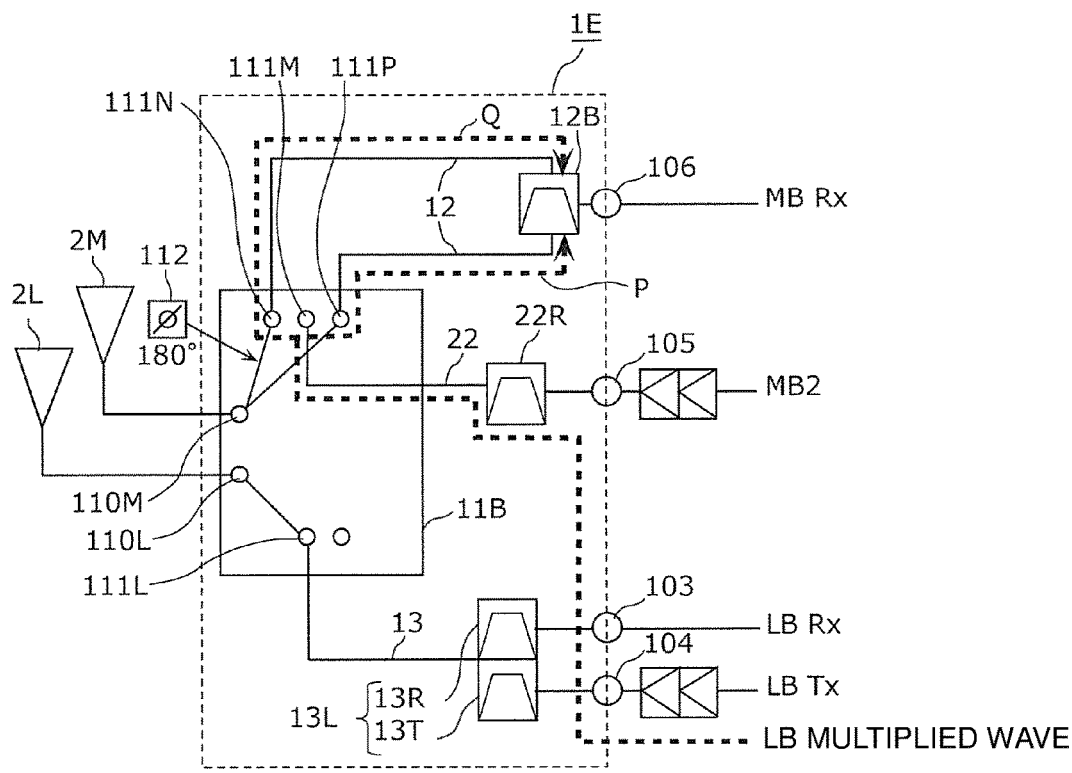
FIG. 7 is a diagram illustrating the circuit configuration and the flow of signals in a front end module according to a modification of the second preferred embodiment of the present invention.

FIG. 7 is a diagram illustrating the circuit configuration and the flow of signals in a front end module 1E according to a modification of the second preferred embodiment. The configuration of the front end module 1E illustrated in FIG. 7 is different from that of the front end module 1D according to the second preferred embodiment in that (1) two signal paths are provided for a second frequency band, (2) a reception-side filter at a second signal path is a balanced filter, and (3) a phase shifter is provided in a switch module. Explanation for features of the front end module 1E according to the present modification that are the same as or similar to those of the front end module 1D according to the second preferred embodiment will be omitted, and differences will be mainly explained.

The front end module 1E includes a switch module 11B, signal paths 12, 13, and 22, the duplexer 13L, filters 12B and 22R, reception terminals 103 and 106, and the transmission terminals 104 and 105.

The signal path 13 is a first signal path between the switch module 11B and each of the transmission terminal 104 and the reception terminal 103, and a signal of a corresponding first frequency band out of multiple frequency bands propagates through the signal path 13. In the present modification, preferably, for example, transmission and reception signals of the Band 8 based on the LTE standards (transmission band: about 880 MHz to about 915 MHz, reception ban: about 925 MHz to about 960 MHz) propagate through the signal path 13.

The signal path 22 is a fourth signal path between the transmission terminal 105 and the switch module 11B. A signal of a corresponding second frequency band of multiple frequency bands propagates through the signal path 22. The second frequency band is preferably higher than the first frequency band. In this modification, preferably for example, a transmission signal of the GSM® high band (GSM®_HB: transmission band: about 1710 MHz to about 1910 MHz) propagates through the signal path 22.

The signal path 12 is a second signal path between the reception terminal 106 and the switch module 11B, and a signal of a corresponding second frequency band of multiple frequency bands propagates through the signal path 12. In the present modification, preferably for example, a reception signal of the Band 3 based on the LTE standards (reception band: about 1805 MHz to about 1880 MHz) propagates through the signal path 12.

In the signal path 13, signal processing is performed by the FDD method, and therefore, the duplexer 13L that enables simultaneous transmission and reception is disposed at the signal path 13. For a signal path in which signal processing is performed by the TDD method, no duplexer may be provided.

In contrast, in the signal path 22, signal processing is performed by the TDD method, and therefore, no duplexer is provided.

The signal path 12 includes two reception paths between the switch module 11B and the filter 12B.

The filter 12B is a balanced/unbalanced conversion reception-side filter that is disposed at the signal path 12 and includes an unbalanced terminal, a first balanced terminal, and a second balanced terminal. The filter 12B converts fundamental waves or harmonics (multiplied waves) of transmission signals of the first frequency band input to the first balanced terminal and the second balanced terminal to have opposite phases, and combines the converted fundamental waves or harmonics (multiplied waves) to be canceled out. Furthermore, reception signals of the second frequency band input from the first balanced terminal and the second balanced terminal pass through the filter 12B to the unbalanced terminal. The unbalanced terminal of the filter 12B is connected to the reception terminal 106, and the first balanced terminal and the second balanced terminal are connected to the switch module 11B.

The filter 22R is a transmission-side filter that is disposed at the signal path 22, and the second frequency band is defined as the pass band of the filter 22R.

The switch module 11B enables connection between the antenna elements 2L and 2M and at least two signal paths of the plurality of signal paths, so that connection between the antenna elements 2L and 2M and the plurality of signal paths are able to be switched. The switch module 11B includes the antenna terminal 110L connected to the antenna element 2L, the antenna terminal 110M connected to the antenna element 2M, the selection terminal 111M, the selection terminal 111P, and the selection terminal 111N. Furthermore, the switch module 11B includes, at a path that connects the antenna terminal 110M to the selection terminal 111N, a phase shifter 112 that inverts phase. The selection terminal 111M is connected to the signal path 22, the selection terminal 111L is connected to the signal path 13, the selection terminal 111P is connected to the first balanced terminal of the filter 12B through the signal path 12, and the selection terminal 111N is connected to the second balanced terminal of the filter 12B through the signal path 12. The antenna terminals 110M and 110L correspond to an antenna terminal of the front end module 1E.

With the above-described connection configuration of the front end module 1E, the antenna element 2L selects between (1) connection with the signal path 13 and (2) non-connection with the signal path 13. Furthermore, the antenna element 2M selects between (1) connection with the signal path 12, (2) connection with the signal path 22, and (3) non-connection with the signal paths 12 and 22. In the case in which a high-frequency signal of the first frequency band propagating through the signal path 13 and a high-frequency signal of the second frequency band propagating through the signal path 12 are subjected to a CA operation, the antenna terminal 110L is connected to the selection terminal 111L, the antenna terminal 110M is connected to the selection terminals 111P and 111N, and the selection terminal 111M is connected to no antenna terminal.

The antenna elements 2L and 2M connected to the front end module 1E according to the present modification may be a single antenna element. In this case, the antenna terminals 110L and 110M of the switch module 11B may be a single antenna terminal, and the single antenna terminal may be connected to two or more selection terminals at the same time.

As illustrated in FIG. 7, in the front end module 1E, a transmission signal of the first frequency band passes through the transmission terminal 104, the transmission-side filter 13T, the signal path 13, and the switch module 11B in that order and is emitted through the antenna element 2L. At this time, in the case in which the frequency of a fundamental wave or harmonic (multiplied wave) of the transmission signal of the first frequency band falls within the second frequency band, the fundamental wave or harmonic of the transmission signal of the first frequency band jumps into the signal path 22 from the signal path 13, passes through the signal path 22 and the selection terminals 111M, 111P, and 111N within the switch module 11B, and flows into the signal path 12.

As a front end module according to a comparative example, a configuration different from the front end module 1E illustrated in FIG. 7 is described in which the filter 12B is not a balanced/unbalanced conversion filter and the signal path 12 that connects the selection terminal 111M to the filter 12B is not provided. In the front end module according to the comparative example, in the case in which a high-frequency signal of a first frequency band propagating through the signal path 13 and a high-frequency signal of a second frequency band propagating through the signal path 12 are subjected to a CA operation, a fundamental wave or harmonic of a transmission signal of the first frequency band flows into a second signal path and then flows into a low-noise amplifier connected to a stage subsequent to the reception terminal 106. Therefore, the reception sensitivity of a reception signal of the second frequency band is degraded.

In contrast, with the front end module 1E according to the present preferred embodiment, in the case in which a high-frequency signal of the first frequency band propagating through the signal path 13 and a high-frequency signal of the second frequency band propagating through the signal path 12 are subjected to a CA operation, a fundamental wave or harmonic component of the first frequency band passing through the signal path 13 and the selection terminals 111M and 111P of the switch module 11B and flowing into the signal path 12 (a path P in FIG. 6) and a fundamental wave or harmonic component of the first frequency band passing through the signal path 13 and the selection terminals 111M and 111N of the switch module 11B and flowing into the signal path 12 (a path Q in FIG. 6) are input to the first balanced terminal and the second balanced terminal of the filter 12B. Then, the filter 12B converts the fundamental wave or harmonic components input to the first balanced terminal and the second balanced terminal to have opposite phases, and combines the converted fundamental wave or harmonic components. That is, in the case in which the signals of the first frequency band and the second frequency band are subjected to a CA operation, the fundamental wave or harmonic components of the first frequency band that have passed through the signal path 13 and the switch module 11B and flowed into the signal path 12 are canceled out by the filter 12B at the reception paths of the signal path 12. In contrast, the reception signals of the second frequency band received at the antenna element 2M pass through the selection terminals 111P and 111N connected to the antenna terminal 110M, and are combined together at the filter 12B. Then, the combined signal is output through the reception terminal 106. At this time, due to the phase shifter 112 provided between the antenna terminal 110M and the selection terminal 111N, the reception signal flowing from the selection terminal 111N to the filter 12B and the reception signal flowing from the selection terminal 111P to the filter 12B have opposite phases. The phases of the two reception signals are inverted by the filter 12B. Therefore, in the filter 12B, the two signals have the same phase, are added together, and output through the unbalanced terminal.

Accordingly, excellent isolation characteristics between multiple frequency bands are able to be ensured, and the reception sensitivity of the second frequency band is improved.

Furthermore, with the front end module 1E according to the present modification, compared to the front end module 1D according to the second preferred embodiment, the filter 12B is also used as a band pass filter disposed at the signal path 12. Therefore, propagating loss of transmission and reception signals of the first frequency band propagating through the signal path 13 is able to be reduced, and a decrease in the number of components and miniaturization are able to be achieved.

Third Preferred Embodiment

In the first preferred embodiment, a configuration in which a balanced/unbalanced conversion element is disposed at a first signal path or a second signal path so that a fundamental wave or harmonic component of a first frequency band is prevented from intruding into the second signal path or a third signal path has been described. Furthermore, in the second preferred embodiment, a configuration in which a balanced/unbalanced conversion element is disposed at a second signal path so that fundamental wave or harmonic components of a first frequency band are canceled out at the second signal path has been described.

In a third preferred embodiment of the present invention, a configuration in which a degradation in the reception sensitivity of a second frequency band by a fundamental wave or harmonic component of a first frequency band is prevented in a state in which no balanced/unbalanced conversion element is disposed at a first signal path or a second signal path that are subjected to a CA operation will be described. Explanation of configuration features of a front end module 1F according to a third preferred embodiment that are the same as or similar to those of the front end module 1 according to the first preferred embodiment will be omitted, and different configuration features will be mainly explained.

Figure 8:
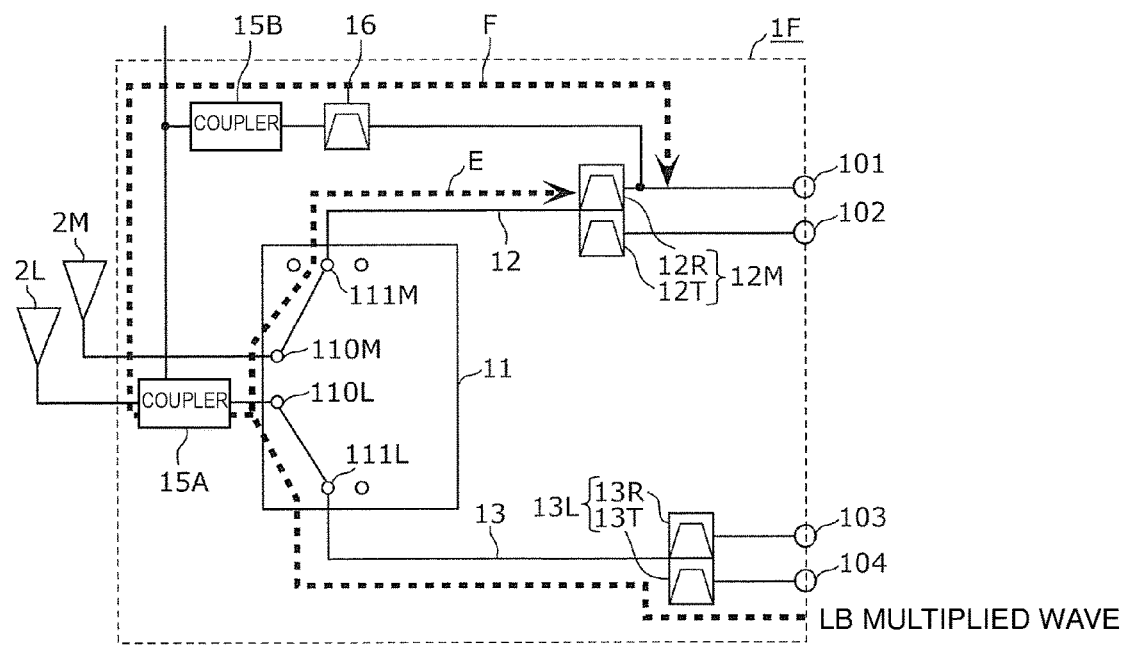
FIG. 8 is a diagram illustrating the circuit configuration and the flow of signals in a front end module according to a third preferred embodiment of the present invention.

FIG. 8 is a diagram illustrating the circuit configuration and the flow of signals in the front end module 1F according to the third preferred embodiment.

The front end module 1F includes the switch module 11, the signal paths 12 and 13, the duplexers 12M and 13L, couplers 15A and 15B, a filter 16, the reception terminals 101 and 103, and the transmission terminals 102 and 104.

The coupler 15A is an electric power detection coupler between the antenna element 2L and the antenna terminal 110L and detects electric power of a high-frequency signal propagating between the antenna element 2L and the antenna terminal 110L.

The coupler 15B is connected to a path through which a high-frequency signal output from the coupler 15A passes, and extracts a portion of electric power of the signal.

The filter 16 has filter characteristics equivalent to those of the reception-side filter 12R disposed at the signal path 12 and phase-inverts a high-frequency signal output from the coupler 15B.

The coupler 15B and the filter 16 define and function as a phase-inversion element that includes an input terminal and an output terminal. The input terminal is connected to a path through which a high-frequency signal output from the coupler 15A propagates, and the output terminal is connected to the reception terminal 101 for the second frequency band.

The coupler 15B may be an attenuator. Furthermore, the filter 16 may be a phase shifter.

The switch module 11 enables connection between the antenna elements 2L and 2M and at least two signal paths of the plurality of signal paths, so that connection between the antenna elements 2L and 2M and the plurality of signal paths is able to be switched. The switch module 11 includes the antenna terminal 110L connected to the antenna element 2L, the antenna terminal 110M connected to the antenna element 2M, the selection terminal 111M, and the selection terminal 111L. The selection terminal 111M is connected to the signal path 12, and the selection terminal 111L is connected to the signal path 13. The antenna terminals 110M and 110L correspond to an antenna terminal of the front end module 1F.

With the above-described connection configuration of the front end module 1F, the antenna element 2L selects between connection and non-connection with the signal path 13, and the antenna element 2M selects between connection and non-connection with the signal path 12. In the case in which a high-frequency signal of the first frequency band propagating through the signal path 13 and a high-frequency of the second frequency band propagating through the signal path 12 are subjected to a CA operation, the antenna terminal 110L is connected to the selection terminal 111L, and the antenna terminal 110M is connected to the selection terminal 111M.

The antenna elements 2L and 2M connected to the front end module 1F according to the present preferred embodiment may be a single antenna element. In this case, the antenna terminals 110L and 110M of the switch module 11 may be a single antenna terminal, and the single antenna terminal may be connected to two or more selection terminals at the same time.

As illustrated in FIG. 8, in the front end module 1F, a transmission signal of the first frequency band passes through the transmission terminal 104, the transmission-side filter 13T, the signal path 13, and the switch module 11 in that order and is emitted through the antenna element 2L. In the case in which the frequency of a fundamental wave or harmonic (multiplied wave) of the transmission signal of the first frequency band falls within the second frequency band, the fundamental wave or harmonic of the transmission signal of the first frequency band passes through the transmission-side filter 13T, the signal path 13, and the selection terminal 111L, the antenna terminal 110L, the antenna terminal 110M, and the selection terminal 111M within the switch module 11, and flows into the signal path 12.

As a front end module according to a comparative example, a configuration is described in which the coupler 15B and the filter 16 are removed from the front end module 1F illustrated in FIG. 8. In the front end module according to the comparative example, in the case in which a high-frequency signal of a first frequency band propagating through the signal path 13 and a high-frequency signal of a second frequency band propagating through the signal path 12 are subjected to a CA operation, a fundamental wave or harmonic of a transmission signal of the first frequency band flows into a second signal path and then flows into a low-noise amplifier connected to a stage subsequent to the reception terminal 101. Therefore, the reception sensitivity of a reception signal of the second frequency band is degraded.

In contrast, with the front end module 1F according to the present preferred embodiment, in the case in which a high-frequency signal of the first frequency band propagating through the signal path 13 and a high-frequency signal of the second frequency band propagating through the signal path 12 are subjected to a CA operation, a fundamental wave or harmonic component of the first frequency band passing through the signal path 13 and the selection terminal 111L, the antenna terminals 110L and 110M, and the selection terminal 111M of the switch module 11 and flowing into the signal path 12 (a path E in FIG. 8) and a fundamental wave or harmonic component of the first frequency band passing through the signal path 13, the switch module 11, the coupler 15A, the coupler 15B, and the filter 16 (a path F in FIG. 8) are input to the reception path of the signal path 12. The fundamental wave or harmonic component of the first frequency band flowing through the path E and the fundamental wave or harmonic component of the first frequency band flowing through the path F are caused to have opposite phases by the filter 16. That is, in the case in which signals of the first frequency band and the second frequency band are subjected to a CA operation, the fundamental wave or harmonic components of the first frequency band that have passed through the signal path 13 and then the switch module 11 and flowed into the signal path 12 are canceled out by the couplers 15A and 15B and the filter 16 at the reception path of the signal path 12. In contrast, a reception signal of the second frequency band received at the antenna element 2M passes through the antenna terminal 110M, the selection terminal 111M, the signal path 12, and the reception-side filter 12R and is output through the reception terminal 101.

Accordingly, excellent isolation characteristics between multiple frequency bands are able to be ensured, and the reception sensitivity of the second frequency band is improved. Furthermore, (1) the existing coupler 15A for electric power detection and a detection path for the coupler 15A are able to be used in a repurposed manner, and (2) there is no need to provide a balun or a phase inversion element to cancel out a fundamental wave or harmonic component of the first frequency band at the signal paths 12 and the 13. Accordingly, propagation loss of signals of the first frequency band and the second frequency band is able to be reduced.

In the front end module 1F according to the present preferred embodiment, fundamental wave or harmonic components of the first frequency band flowing through the paths E and F are combined together at the reception path of the signal path 12. However, these fundamental wave or harmonic components may be combined together at the reception-side filter 12R. In this case, the reception-side filter 12R is a balanced input filter, and the filter 16 may be a phase inversion element.

Front end modules and communication apparatuses according to preferred embodiments of the present invention have been described above by way of preferred embodiments and modifications thereof. However, front end modules and communication apparatuses according to the present invention are not limited to the foregoing preferred embodiments and modifications thereof. Other preferred embodiments provided by combining any components in the foregoing preferred embodiments and modifications thereof, modifications obtained by making various modifications to the foregoing preferred embodiments and modifications thereof conceived by those skilled in the art without departing from the scope of the present invention, various types of equipment including front end modules and communication apparatuses disclosed herein are also included in the present invention.

Furthermore, in front end modules and communication apparatuses according to the foregoing preferred embodiments and modifications thereof, a high-frequency circuit element, a wire, and other components may be inserted in a path that connects individual circuit elements and signal paths disclosed in drawings.

Preferred embodiments of the present invention may be widely used as multiband/multimode front end modules that perform a carrier aggregation method for communication apparatuses, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A front end module that performs a carrier aggregation method in which communication is performed using a signal of a first frequency band that is selected from among multiple frequency bands and a signal of a second frequency band that is selected from among the multiple frequency bands and different from the first frequency band at a same time, the front end module comprising:
   a first antenna terminal and a second antenna terminal that are connected to an antenna element;
   a plurality of transmission terminals to which transmission signals are input;
   a plurality of reception terminals that output reception signals;
   a plurality of signal paths between the first antenna terminal and each of a corresponding one of the plurality of transmission terminals and a corresponding one of the plurality of reception terminals and between the second antenna terminal and each of a corresponding one of the plurality of transmission terminals and a corresponding one of the plurality of reception terminals, signals of corresponding frequency bands of the multiple frequency bands propagating through the plurality of signal paths, the plurality of signal paths including a first signal path and a second signal path;
   a switch module that includes the first antenna terminal, the second antenna terminal, and a plurality of selection terminals, the switch module being disposed between the antenna element and the plurality of signal paths, capable of performing connection between the first antenna terminal and the first signal path and connection between the second antenna terminal and the second signal path at the same time, and switches connection between the antenna element and the plurality of signal paths; and
   a balanced/unbalanced conversion element that is disposed at the first signal path through which a signal of the first frequency band propagates or at the second signal path through which a signal of the second frequency band propagates, of the plurality of signal paths, and includes an unbalanced terminal, a first balanced terminal, and a second balanced terminal; wherein a frequency of a fundamental wave or a harmonic of a transmission signal of the first frequency band at least partially overlaps with a frequency of a signal of the second frequency band;

the first balanced terminal and the second balanced terminal are connected to a first selection terminal and a second selection terminal, respectively, of the plurality of selection terminals; and the balanced/unbalanced conversion element causes the fundamental wave or harmonic that is input through the unbalanced terminal to branch into branch signals having opposite phases and outputs the branch signals to the first balanced terminal and the second balanced terminal.

2. The front end module according to claim 1, wherein the balanced/unbalanced conversion element is disposed at the first signal path; and when a signal of the first frequency band and a signal of the second frequency band are subjected to a carrier aggregation operation, at least one of the first selection terminal and the second selection terminal is connected to neither the first antenna terminal nor the second antenna terminal.

3. The front end module according to claim 1, wherein the balanced/unbalanced conversion element is disposed at the second signal path;

the plurality of signal paths include a third signal path; and when the first signal path through which a signal of the first frequency band propagates and the third signal path through which a signal of the second frequency band propagates are subjected to a carrier aggregation operation, the first selection terminal and the second selection terminal are connected to neither the first antenna terminal nor the second antenna terminal.

4. The front end module according to claim 3, wherein the balanced/unbalanced conversion element is a filter element for which the second frequency band is defined as a pass band.

5. The front end module according to claim 3, wherein transmission and reception signals of Band 8 based on LTE (Long Term Evolution) standards propagate through the first signal path;

a transmission signal of GSM®_HB propagates through the second signal path; and a high-frequency signal of Band 3 based on the LTE standards propagates through the third signal path.

6. The front end module according to claim 1, further comprising:

a first duplexer that is disposed at the first signal path, a transmission signal and a reception signal of the first frequency band passing through the first duplexer; and a second duplexer that is disposed at the second signal path, a transmission signal and a reception signal of the second frequency band passing through the second duplexer.

7. The front end module according to claim 1, further comprising:

a first amplification circuit that is connected to a transmission terminal for the first signal path and amplifies a transmission signal of the first frequency band in advance; and a second amplification circuit that is connected to a transmission terminal for the second signal path and amplifies a transmission signal of the second frequency band in advance.

8. A front end module that performs a carrier aggregation method in which communication is performed using a signal of a first frequency band that is selected from among multiple frequency bands and a signal of a second frequency band that is selected from among the multiple frequency bands and different from the first frequency band at the same time, the front end module comprising:

a first antenna terminal and a second antenna terminal that are connected to an antenna element;

a plurality of transmission terminals to which transmission signals are input;

a plurality of reception terminals that output reception signals;

a plurality of signal paths between the first antenna terminal and each of a corresponding one of the plurality of transmission terminals and a corresponding one of the plurality of reception terminals and between the second antenna terminal and each of a corresponding one of the plurality of transmission terminals and a corresponding one of the plurality of reception terminals, signals of corresponding frequency bands of the multiple frequency bands propagating through the plurality of signal paths, the plurality of signal paths including a first signal path and a second signal path;

a switch module that includes the first antenna terminal, the second antenna terminal, and a plurality of selection terminals, the switch module being disposed between the antenna element and the plurality of signal paths, capable of performing connection between the first antenna terminal and the first signal path and connection between the second antenna terminal and the second signal path at the same time, and switches connection between the antenna element and the plurality of signal paths; and a balanced/unbalanced conversion element that is disposed at the second signal path through which a signal of the second frequency band propagates, of the plurality of signal paths, and includes a first balanced terminal, a second balanced terminal, and an unbalanced terminal that is connected to a reception terminal for the second frequency band; wherein a frequency of a fundamental wave or harmonic of a transmission signal of the first frequency band at least partially overlaps with that of a signal of the second frequency band; and the balanced/unbalanced conversion element converts the fundamental waves or harmonics that pass through the first signal path through which a signal of the first frequency band propagates and the switch module and are input to the first balanced terminal and the second balanced terminal to have opposite phases and combines the converted fundamental waves or harmonics.

9. The front end module according to claim 8, wherein the plurality of signal paths include a fourth signal path;

the balanced/unbalanced conversion element is a filter element for which the second frequency band is defined as a pass band;

the first balanced terminal and the second balanced terminal are connected to a first selection terminal and a second selection terminal, respectively, of the plurality of selection terminals;

the switch module includes a phase inversion element that inverts a phase of a high-frequency reception signal of the second frequency band propagating from the second antenna terminal to the first selection terminal; and when the first signal path and the second signal path are subjected to a carrier aggregation operation, by connecting the first selection terminal and the second selection terminal to the second antenna terminal, a reception signal of the second frequency band passes through the balanced/unbalanced conversion element, and the balanced/unbalanced conversion element converts the fundamental waves or harmonics that pass through the fourth signal path through which a signal of the second frequency band propagates and the switch module and are input to the first balanced terminal and the second balanced terminal to have opposite phases, so that the converted fundamental waves or harmonics cancel each other out.

10. The front end module according to claim 9, wherein
transmission and reception signals of Band 8 based on LTE standards propagate through the first signal path;
transmission and reception signals of Band 3 based on the LTE standards propagate through the second signal path; and
a transmission signal of GSM®_HB propagates through the fourth signal path.

11. A front end module that performs a carrier aggregation method in which communication is performed using a signal of a first frequency band that is selected from among multiple frequency bands and a signal of a second frequency band that is selected from among the multiple frequency bands and different from the first frequency band at the same time, the front end module comprising:
a first antenna terminal and a second antenna terminal that are connected to an antenna element;
a plurality of transmission terminals to which transmission signals are input;
a plurality of reception terminals that output high-frequency reception signals;
a plurality of signal paths between the first antenna terminal and each of a corresponding one of the plurality of transmission terminals and a corresponding one of the plurality of reception terminals and between the second antenna terminal and each of a corresponding one of the plurality of transmission terminals and a corresponding one of the plurality of reception terminals, signals of corresponding frequency bands of the multiple frequency bands propagating through the plurality of signal paths, the plurality of signal paths including a first signal path and a second signal path;
a switch module that includes the first antenna terminal, the second antenna terminal, and a plurality of selection terminals, is disposed between the antenna element and the plurality of signal paths, the switch module being capable of performing connection between the first antenna terminal and the first signal path and connection between the second antenna terminal and the second signal path at the same time, and switches connection between the antenna element and the plurality of signal paths;
an electric power detection coupler between the first antenna terminal and the antenna element; and
a phase inversion element that includes an input terminal and an output terminal, the input terminal being connected to the electric power detection coupler, the output terminal being connected to a reception terminal for the second frequency band; wherein
a frequency of a fundamental wave or harmonic of a transmission signal of the first frequency band partially overlaps with a signal of the second frequency band; and
the phase inversion element receives the fundamental wave or harmonic of the transmission signal of the first frequency band that has passed through the electric power detection coupler, inverts a phase of the fundamental wave or harmonic, and outputs the phase-inverted fundamental wave or harmonic.

12. A communication apparatus comprising:
an RF signal processing circuit that processes a high-frequency signal transmitted and received at the antenna element; and
the front end module according to claim 1 that transmits the high-frequency signal between the antenna element and the RF signal processing circuit.

13. The communication apparatus according to claim 12, wherein
the balanced/unbalanced conversion element is disposed at the first signal path; and
when a signal of the first frequency band and a signal of the second frequency band are subjected to a carrier aggregation operation, at least one of the first selection terminal and the second selection terminal is connected to neither the first antenna terminal nor the second antenna terminal.

14. The communication apparatus according to claim 12, wherein
the balanced/unbalanced conversion element is disposed at the second signal path;
the plurality of signal paths include a third signal path; and
when the first signal path through which a signal of the first frequency band propagates and the third signal path through which a signal of the second frequency band propagates are subjected to a carrier aggregation operation, the first selection terminal and the second selection terminal are connected to neither the first antenna terminal nor the second antenna terminal.

15. The communication apparatus according to claim 14, wherein the balanced/unbalanced conversion element is a filter element for which the second frequency band is defined as a pass band.

16. A communication apparatus comprising:
an RF signal processing circuit that processes a high-frequency signal transmitted and received at the antenna element; and
the front end module according to claim 8 that transmits the high-frequency signal between the antenna element and the RF signal processing circuit.

17. The communication apparatus according to claim 16, wherein
the plurality of signal paths include a fourth signal path;
the balanced/unbalanced conversion element is a filter element for which the second frequency band is defined as a pass band;
the first balanced terminal and the second balanced terminal are connected to a first selection terminal and a second selection terminal, respectively, of the plurality of selection terminals;
the switch module includes a phase inversion element that inverts a phase of a high-frequency reception signal of the second frequency band propagating from the second antenna terminal to the first selection terminal; and
when the first signal path and the second signal path are subjected to a carrier aggregation operation, by connecting the first selection terminal and the second selection terminal to the second antenna terminal, a reception signal of the second frequency band passes through the balanced/unbalanced conversion element, and the balanced/unbalanced conversion element converts the fundamental waves or harmonics that pass through the fourth signal path through which a signal of the second frequency band propagates and the switch module and are input to the first balanced terminal and the second balanced terminal to have opposite phases, so that the converted fundamental waves or harmonics cancel each other out.

18. A communication apparatus comprising:
an RF signal processing circuit that processes a high-frequency signal transmitted and received at the antenna element; and
the front end module according to claim 11 that transmits the high-frequency signal between the antenna element and the RF signal processing circuit.

19. The communication apparatus according to claim 18, further comprising:
a first duplexer that is disposed at the first signal path, a transmission signal and a reception signal of the first frequency band passing through the first duplexer; and
a second duplexer that is disposed at the second signal path, a transmission signal and a reception signal of the second frequency band passing through the second duplexer.

20. The communication apparatus according to claim 18, further comprising:
a first amplification circuit that is connected to a transmission terminal for the first signal path and amplifies a transmission signal of the first frequency band in advance; and
a second amplification circuit that is connected to a transmission terminal for the second signal path and amplifies a transmission signal of the second frequency band in advance.

\* \* \* \* \*